(12) United States Patent
Choi et al.

(10) Patent No.: US 10,727,426 B2
(45) Date of Patent: Jul. 28, 2020

(54) THIN FILM TRANSISTOR, METHOD OF MANUFACTURING THE SAME, AND ELECTRONIC DEVICE INCLUDING THE SAME

(71) Applicant: Samsung Electronics Co., Ltd., Suwon-si, Gyeonggi-do (KR)

(72) Inventors: Ajeong Choi, Suwon-si (KR); Eun Kyung Lee, Seoul (KR); Joo Young Kim, Hwanseong-si (KR); Jeong Il Park, Seongnam-si (KR); Youngjun Yun, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/384,968

(22) Filed: Dec. 20, 2016

(65) Prior Publication Data
US 2017/0179414 A1    Jun. 22, 2017

(30) Foreign Application Priority Data

Dec. 21, 2015 (KR) .................. 10-2015-0182702

(51) Int. Cl.
*H01L 51/05* (2006.01)
*H01L 51/00* (2006.01)

(52) U.S. Cl.
CPC ...... *H01L 51/0533* (2013.01); *H01L 51/0071* (2013.01); *H01L 51/0074* (2013.01);
(Continued)

(58) Field of Classification Search
CPC ............. H01L 51/0533; H01L 51/0071; H01L 51/0074; H01L 51/0003; H01L 51/0558; Y02P 70/521; Y02E 10/549
See application file for complete search history.

(56) References Cited

U.S. PATENT DOCUMENTS 4,861,908 A    8/1989 Satoh et al.
7,573,063 B1*  8/2009 Liu ................ H01L 51/052
                                                 257/347
(Continued)

FOREIGN PATENT DOCUMENTS

EP    2671880 A1    12/2013
JP    2008-298862 A  12/2008
(Continued)

OTHER PUBLICATIONS

European Search Report dated May 15, 2017 for corresponding European Patent Application No. 16205716.0.
(Continued)

*Primary Examiner* — Benjamin Tzu-Hung Liu
(74) *Attorney, Agent, or Firm* — Harness, Dickey & Pierce, P.L.C.

(57) ABSTRACT

A thin film transistor includes a gate electrode, an organic semiconductor overlapping the gate electrode, an insulator between the gate electrode and the organic semiconductor, and a source electrode and a drain electrode electrically connected to the organic semiconductor, respectively. The organic semiconductor is capable of being applied by a solution process, the insulator includes an inorganic insulating layer having a surface facing the organic semiconductor, and the surface includes a coating with a polysiloxane having an acrylic terminal group.

15 Claims, 3 Drawing Sheets

(52) U.S. Cl.
CPC ...... *H01L 51/0003* (2013.01); *H01L 51/0558* (2013.01); *Y02E 10/549* (2013.01); *Y02P 70/521* (2015.11)

(56) References Cited

U.S. PATENT DOCUMENTS

| | | | |
|---|---|---|---|
| 2003/0102472 A1* | 6/2003 | Kelley | H01L 21/02126 257/40 |
| 2007/0012914 A1* | 1/2007 | Miura | H01L 51/0012 257/40 |
| 2013/0320316 A1* | 12/2013 | Park | H01L 51/005 257/40 |
| 2013/0337259 A1* | 12/2013 | Carcia | C09D 5/00 428/336 |
| 2015/0168837 A1* | 6/2015 | Loccufier | B41C 1/1008 430/272.1 |
| 2015/0243915 A1* | 8/2015 | Wigglesworth | H01L 51/0043 257/40 |

FOREIGN PATENT DOCUMENTS

| | | |
|---|---|---|
| JP | 2013-035274 A | 2/2013 |
| WO | WO-03/041186 A2 | 5/2003 |
| WO | WO-2013-182328 A1 | 12/2013 |

OTHER PUBLICATIONS

Chuan Liu et al., "Solution-Processable Organic Single Crystals with Bandlike Transport in Field-Effect Transistors", Advanced Materials, 2011, vol. 23 pp. 523-526.

W. Ou-Yang et al., "High-performance organic transistors with high-k dielectrics: A comparative study on solution-processed single crystals and vacuum-deposited polycrystalline films of 2,9-didecyl-dinaphtho[2,3-b:2'3'-f]thieno[3,2-b]thiophene", Applied Physics Letters 101, AIP Publishing, 2012.

Jihua Chen et al., "Controlled solution deposition and systematic study of charge-transport anisotropy in single crystal and single-crystal textured TIPS pentacene thin films" Organic Electronics 10, 2009, pp. 696-703.

* cited by examiner

THIN FILM TRANSISTOR, METHOD OF MANUFACTURING THE SAME, AND ELECTRONIC DEVICE INCLUDING THE SAME

CROSS REFERENCE TO RELATED APPLICATION

This application claims priority to and the benefit of Korean Patent Application No. 10-2015-0182702 filed in the Korean Intellectual Property Office on Dec. 21, 2015, the entire contents of which are incorporated herein by reference.

BACKGROUND

1. Field

Some example embodiments relate to a thin film transistor, a method of manufacturing the same, and/or an electronic device including the same.

2. Description of the Related Art

A flat panel display (e.g., a liquid crystal display (LCD), an organic light emitting diode (OLED) display, and/or an electrophoretic display) includes a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pair of the electric field-generating electrodes is commonly connected to a switching device and receives an electrical signal, and the electrical optical active layer transforms the electrical signal into an optical signal and thus displays an image.

The flat panel display includes a thin film transistor panel having a thin film transistor (TFT), which is a three-terminal element as a switching device, a gate line transmitting a scan signal for controlling the thin film transistor, and a data line transmitting a signal applied to a pixel electrode. Among the thin film transistors, studies on the organic thin film transistor, i.e., OTFT, which includes organic semiconductors, including, for example, a low molecular material or high molecular polymers, instead of inorganic semiconductors, including, for example, silicon (Si) have been actively performed.

Recently, as a material for a channel of the TFT, organic materials, e.g., pentacene or polythiophene, have been studied. Among them, relatively low-molecular-weight organic materials, e.g., pentacene, may have a relatively high charge mobility of about 3.2 to about 5.0 cm$^2$/Vs or more, but may require a relatively expensive apparatus for vacuum deposition at the time of forming a thin film. In the case of polymer or oligomer organic materials, e.g., F8T2 (poly(9, 9-dioctylfluorene-co-bithiophene)) as a polythiophene-based material, a solution process, e.g., spin casting, may be desirably applied. However, as for the capability of the organic semiconductor material being subjected to a solution process, a surface treatment between the insulator and the organic material may be required for improving crystallinity of a thin film of the organic semiconductor formed on the insulator and for improving reliability of a device. Furthermore, the reliability of a device and applicability of the organic semiconductor material may be dependent upon the surface treatment.

SUMMARY

Example embodiments provide a thin film transistor including an organic semiconductor capable of being applied by a solution process, and having improved processibility, reliability, and charge mobility.

Example embodiments provide a method of manufacturing the thin film transistor.

Example embodiments provide an electronic device including the thin film transistor.

According to example embodiments, a thin film transistor includes a gate electrode, an organic semiconductor overlapping the gate electrode, an insulator between the gate electrode and the organic semiconductor, and a source electrode and a drain electrode electrically connected to the organic semiconductor, respectively. The organic semiconductor is capable of being applied by a solution process, the insulator includes an inorganic insulating layer having a surface facing the organic semiconductor, and the surface includes a coating with a polysiloxane having an acrylic terminal group.

The organic semiconductor may be represented by Chemical Formula 1:

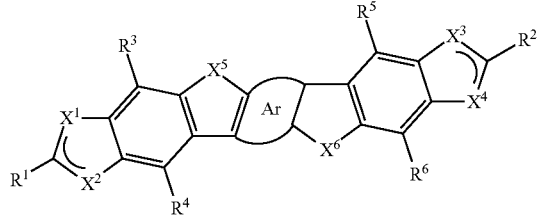

[Chemical Formula 1]

In Chemical Formula 1,

Ar is a substituted or unsubstituted $C_6$ to $C_{30}$ aromatic cyclic group, each of $X^1$ to $X^4$ are independently one of O, S, Se, Te, N—$R^a$, and $CR^b$, wherein each of $R^a$ and $R^b$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —$OR^{11}$, wherein $R^{11}$ is a substituted or unsubstituted $C_6$ to $C_{30}$ aryl group, a substituted or unsubstituted $C_4$ to $C_{30}$ cycloalkyl group, —$OR^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2 R^{14}$, wherein $R^{14}$ is a substituted or unsubstituted $C_1$ to $C_{30}$ alkyl group, and —NHC(=O)$OR^{15}$, wherein $R^{15}$ is a substituted or unsubstituted $C_1$ to $C_{30}$ alkyl group, at least one of $X^1$ and $X^2$ is selected from O, S, Se, Te, and N—$R^a$, at least one of $X^3$ and $X^4$ is selected from O, S, Se, Te, and N—$R^a$, each of $X^5$ and $X^6$ are independently one of O, S, Se, Te, N—$R^a$, and $CR^b R^c$ wherein each of $R^a$ to $R^c$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, $-OR^{11}$, wherein $R^{11}$ is a substituted or unsubstituted $C_6$ to $C_{30}$ aryl group, a substituted or unsubstituted $C_4$ to $C_{30}$ cycloalkyl group, $-OR^{12}$, wherein $R^{12}$ is a substituted or unsubstituted $C_4$ to $C_{30}$ cycloalkyl group, a substituted or unsubstituted $C_2$ to $C_{30}$ heteroaryl group, $-C(=O)R^{13}$, wherein $R^{13}$ is a substituted or unsubstituted $C_1$ to $C_{30}$ alkyl group, $-S(=O)_2R^{14}$, wherein $R^{14}$ is a substituted or unsubstituted $C_1$ to $C_{30}$ alkyl group, and $-NHC(=O)OR^{15}$, wherein $R^{15}$ is a substituted or unsubstituted $C_1$ to $C_{30}$ alkyl group, and each of $R^1$ to $R^6$ are independently one of hydrogen, $-F$, $-Cl$, $-Br$, $-I$, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group.

The organic semiconductor may be one of fused polycyclic heteroaromatic compounds represented by the following Chemical Formulae 1A to 1G:

[Chemical Formula 1A]

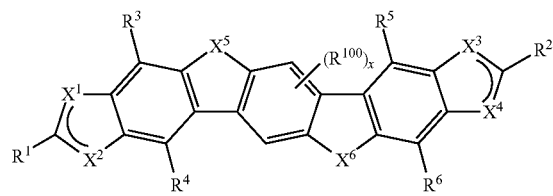

[Chemical Formula 1B]

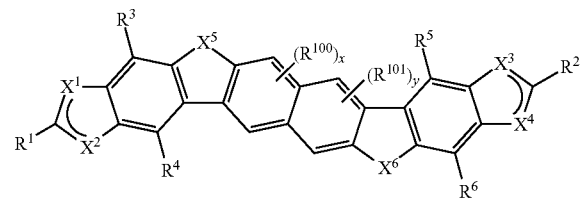

[Chemical Formula 1C]

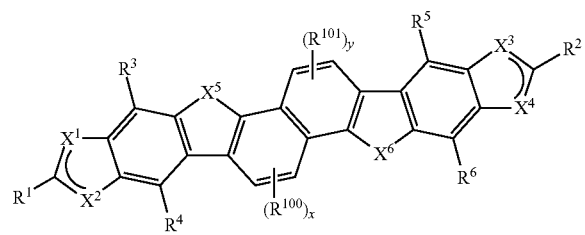

[Chemical Formula 1D]

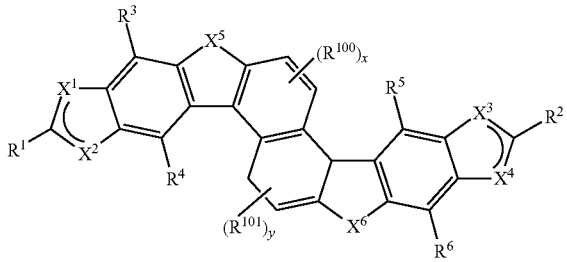

[Chemical Formula 1E]

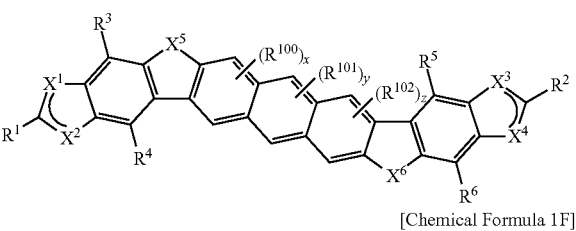

[Chemical Formula 1F]

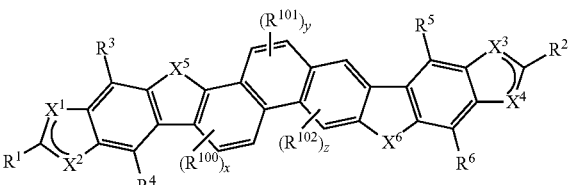

[Chemical Formula 1G]

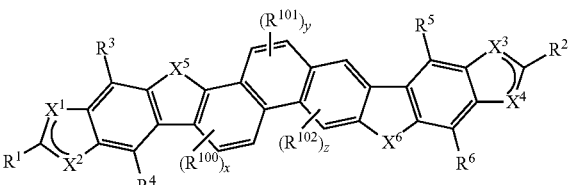

In the above Chemical Formulae 1A to 1G,
each of $X^1$, $X^2$, $X^3$, $X^4$, $X^5$, $X^6$, $R^1$, $R^2$, $R^3$, $R^4$, $R^5$ and $R^6$ are the same as in Chemical Formula 1, each of $R^{100}$ to $R^{102}$ are independently one of hydrogen, $-F$, $-Cl$, $-Br$, $-I$, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group, and each of x, y, and z are integers of 1 or 2.

In Chemical Formula 1, one of $X^1$ and $X^2$ and one of $X^3$ and $X^4$ may be selenium (Se), and one of $X^5$ and $X^6$ may be sulfur (S).

In Chemical Formula 1, Ar may be one of substituted or unsubstituted benzene, substituted or unsubstituted naphthalene, and substituted or unsubstituted anthracene, and each of $R^1$ and $R^2$ may be independently a $C_1$ to $C_{30}$ alkyl group.

The inorganic insulating layer may include one of $SiO_x$, $SiN_x$, $AlO_x$, or a combination thereof.

The inorganic insulating layer may have a thickness of about 100 nanometers to about 500 nanometers.

The polysiloxane having an acrylic terminal group may be represented by Chemical Formula 2:

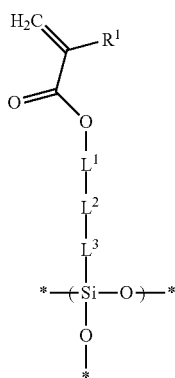

[Chemical Formula 2]

In Chemical Formula 2, $R^1$ may be hydrogen or a substituted or unsubstituted $C_1$ to $C_{20}$ alkyl group, each of $L^1$ and $L^3$ are independently one of a substituted or unsubstituted $C_1$ to $C_{20}$ alkylene group, a substituted or unsubstituted $C_6$ to $C_{20}$ arylene group, a substituted or unsubstituted $C_3$ to $C_{20}$ cycloalkylene group, a substituted or unsubstituted $C_2$ to $C_{20}$ alkenylene group, a substituted or unsubstituted $C_2$ to $C_{20}$ alkynylene group, —R—O—R'—, —R—N—R'—, —R—(C=O)—R'— (wherein, each of R and R' are independently a $C_1$ to $C_{10}$ hydrocarbon radical), and a combination thereof, and $L^2$ is one of —O—(C=O)—NR"—, —(C=O)—NR"— (wherein, R" is one of hydrogen and a $C_1$ to $C_6$ hydrocarbon radical), —O—, —COO—, and —S—, and

* is a portion linked to an adjacent molecule.

In Chemical Formula 2, $R^1$ may be hydrogen or methyl group, each of $L^1$ and $L^3$ may be independently a $C_1$ to $C_{20}$ alkylene group, and $L^2$ may be —(C=O)—NR"— (wherein, R" is one of hydrogen and a $C_1$ to $C_6$ hydrocarbon radical).

In Chemical Formula 2, $R^1$ may be hydrogen, $L^2$ may be —(C=O)—NR"— (wherein, R" is hydrogen), and each of $L^1$ and $L^3$ may be a propylene group.

The coating of the polysiloxane may have a thickness of about 10 nanometers to about 50 nanometers.

The gate electrode may be on a substrate including one of silica, glass, and plastic.

According to example embodiments, a method of manufacturing a thin film transistor includes forming a gate electrode, forming an insulator on the gate electrode including forming an inorganic insulating layer on the gate electrode, and coating a polysiloxane having an acrylic terminal group represented by Chemical Formula 2 on a surface of the inorganic insulating layer, forming an organic semiconductor on the insulator by coating the organic semiconductor on the coated surface of the inorganic insulating layer, and forming a source electrode and a drain electrode electrically connected to the organic semiconductor, respectively:

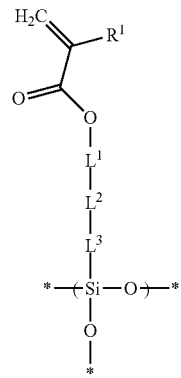

[Chemical Formula 2]

In Chemical Formula 2, $R^1$ is hydrogen or a substituted or unsubstituted $C_1$ to $C_{20}$ alkyl group, each of $L^1$ and $L^3$ are independently one of a substituted or unsubstituted $C_1$ to $C_{20}$ alkylene group, a substituted or unsubstituted $C_6$ to $C_{20}$ arylene group, a substituted or unsubstituted $C_3$ to $C_{20}$ cycloalkylene group, a substituted or unsubstituted $C_2$ to $C_{20}$ alkenylene group, a substituted or unsubstituted $C_2$ to $C_{20}$ alkynylene group, —R—O—R'—, —R—N—R'—, —R—(C=O)—R'— (wherein, each of R and R' are independently $C_1$ to $C_{10}$ hydrocarbon radical), and a combination thereof, $L^2$ is one of —O—(C=O)—NR"—, —(C=O)—NR"— (wherein, R" is one of hydrogen and a $C_1$ to $C_6$ hydrocarbon radical), —O—, —COO—, and —S—, and

* is a portion linked to an adjacent molecule.

In Chemical Formula 2, $R^1$ may be hydrogen or methyl group, each of $L^1$ and $L^3$ may be independently a $C_1$ to $C_{20}$ alkylene group, and $L^2$ may be —(C=O)—NR"— (wherein, R" is one of hydrogen and a $C_1$ to $C_6$ hydrocarbon radical).

Forming the organic semiconductor may coat the organic semiconductor represented by Chemical Formula 1 on the coated surface of the inorganic insulating layer:

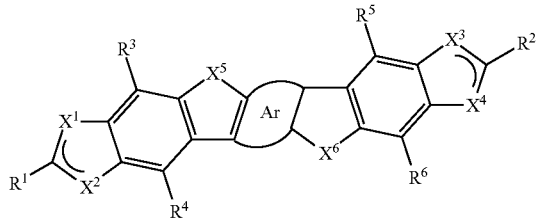

[Chemical Formula 1]

In Chemical Formula 1,

Ar is a substituted or unsubstituted $C_6$ to $C_{30}$ aromatic cyclic group, each of $X^1$ to $X^4$ are independently one of O, S, Se, Te, N—$R^a$, and $CR^b$, wherein each of $R^a$ and $R^b$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —$OR^{11}$, wherein $R^{11}$ is a substituted or unsubstituted $C_6$ to $C_{30}$ aryl group, a substituted or unsubstituted $C_4$ to $C_{30}$ cycloalkyl group, —$OR^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2R^{14}$, wherein $R^{14}$ is a substituted or unsubstituted $C_1$ to $C_{30}$ alkyl group, and —NHC(=O)O$R^{15}$, wherein $R^{15}$ is a substituted or unsubstituted $C_1$ to $C_{30}$ alkyl group, at least one of $X^1$ and $X^2$ is selected from O, S, Se, Te, and N—$R^a$, at least one of $X^3$ and $X^4$ is selected from O, S, Se, Te, and N—$R^a$, each of $X^5$ and $X^6$ are independently one of O, S, Se, Te, N—$R^a$, and C$R^bR^c$ wherein each of $R^a$ to $R^c$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —O$R^{11}$, wherein $R^{11}$ is a substituted or unsubstituted $C_6$ to $C_{30}$ aryl group, a substituted or unsubstituted $C_4$ to $C_{30}$ cycloalkyl group, —O$R^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2R^{14}$, wherein $R^{14}$ is a substituted or unsubstituted $C_1$ to $C_{30}$ alkyl group and —NHC(=O)O$R^{15}$, wherein $R^{15}$ is a substituted or unsubstituted $C_1$ to $C_{30}$ alkyl group, and each of $R^1$ to $R^6$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group.

Forming the organic semiconductor on the insulator may coat at least one of fused polycyclic heteroaromatic compounds represented by the following Chemical Formulae 1A to 1G on the coated surface of the inorganic insulating layer:

[Chemical Formula 1A]

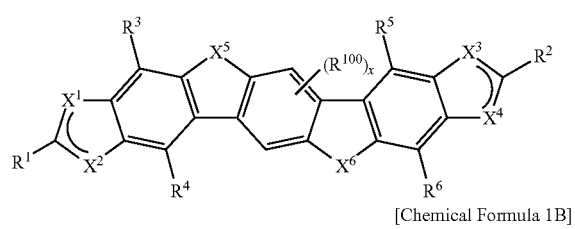

[Chemical Formula 1B]

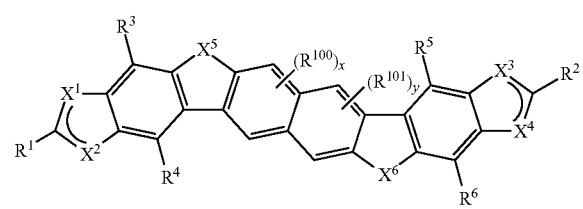

[Chemical Formula 1C]

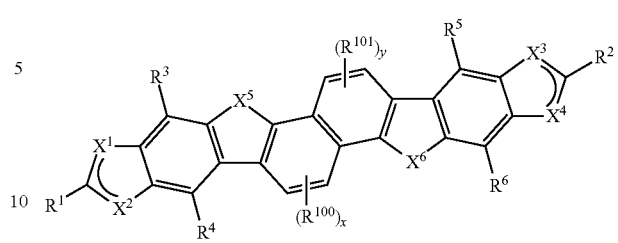

[Chemical Formula 1D]

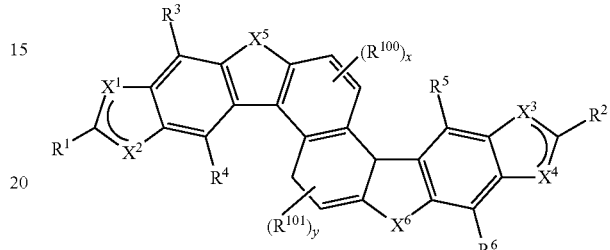

[Chemical Formula 1E]

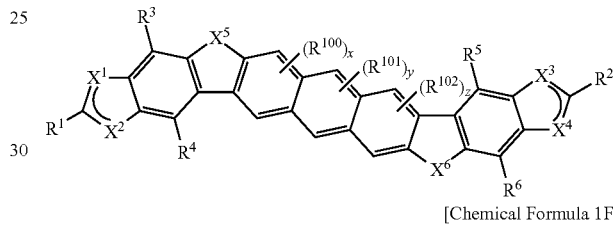

[Chemical Formula 1F]

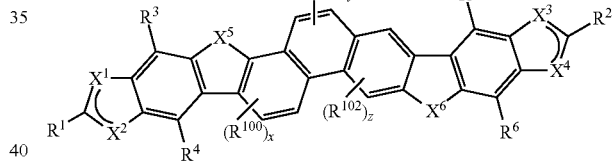

[Chemical Formula 1G]

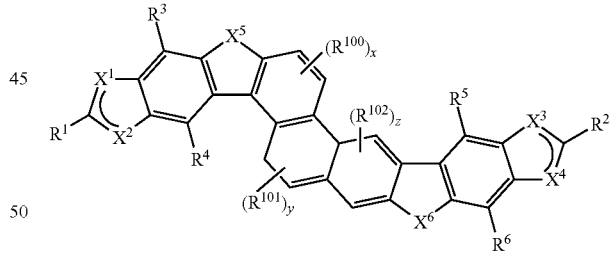

In the above Chemical Formulae 1A to 1G, each of $X^1$, $X^2$, $X^3$, $X^4$, $X^5$, $X^6$, $R^1$, $R^2$, $R^3$, $R^4$, $R^5$ and $R^6$ are the same as in Chemical Formula 1, each of $R^{100}$ to $R^{102}$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group, and each of x, y, and z are integers of 1 or 2.

Forming the inorganic insulating layer may deposit one of $SiO_x$, $SiN_x$, $AlO_x$, and a combination thereof using a plasma-enhanced chemical vapor deposition (PECVD) method or an atomic layer deposition (ALD) method at a thickness of about 100 nanometers to about 500 nanometers.

Coating the polysiloxane may coat the polysiloxane at a thickness of about 10 nanometers to about 50 nanometers.

According to example embodiments, an electronic device includes a thin film transistor of example embodiments.

The electronic device may be at least one of a liquid crystal display device, an organic light-emitting diode, an electrophoresis display device, an organic sensor, a solar cell, and a combination thereof.

DETAILED DESCRIPTION

Figure 1:
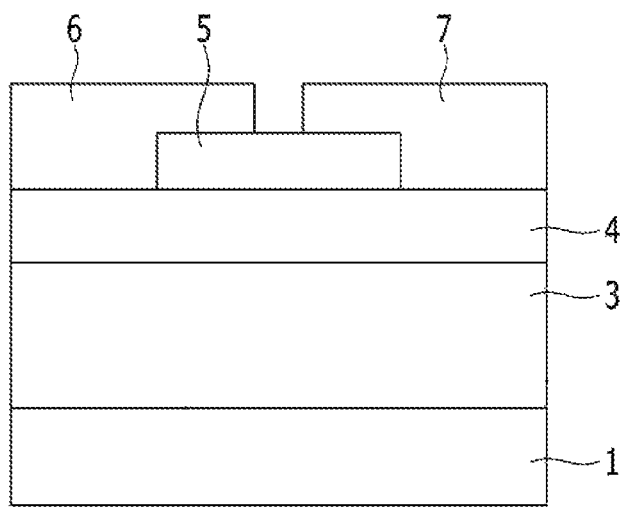
FIG. 1 is a cross-sectional view showing a thin film transistor panel according to example embodiments.

The present disclosure will be described more fully hereinafter with reference to the accompanying drawings, in which example embodiments are shown. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," etc.) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

As used herein, the term "combination thereof" refers to a mixture, a stacked structure, a composite, or an alloy.

As used herein, when a definition is not otherwise provided, the term "hetero" may refer to one including 1 to 4 heteroatoms selected from N, O, S, Si, and P. The total number of ring members may be 3 to 10. If multiple rings are present, each ring is independently aromatic, saturated, or partially unsaturated, and multiple rings, if present, may be fused, pendant, spirocyclic, or a combination thereof. The term "heterocycloalkyl group" may be at least one non-aromatic ring including a heteroatom, and the term "heteroaryl group" may be at least one aromatic ring including a heteroatom. Non-aromatic and/or carbocyclic rings may also be present in a heteroaryl group, provided that at least one ring is both aromatic and contains a ring member that is a heteroatom.

As used herein, when a definition is not otherwise provided, the term "alkyl group" may be a linear or branched saturated monovalent hydrocarbon group (e.g., a methyl group, an ethyl group, a propyl group, an isobutyl group, a sec-butyl group, a tert-butyl group, a pentyl group, an iso-amyl group, and/or a hexyl group).

The term "alkenyl group" may refer to a linear or branched unsaturated monovalent hydrocarbon group including at least one carbon-carbon double bond (e.g., an ethenyl group).

The term "alkynyl group" may refer to a linear or branched unsaturated monovalent hydrocarbon group including at least one carbon-carbon triple bond (e.g., ethynyl group).

The term "alkoxy group" may refer to an alkyl group that is linked via an oxygen, e.g., a methoxy, an ethoxy, and a sec-butyloxy group.

The term "aryl group" may refer to a monovalent functional group formed by the removal of one hydrogen atom from one or more rings of an arene, e.g., phenyl or naphthyl. The arene may refer to a hydrocarbon having an aromatic ring, and includes monocyclic and polycyclic hydrocarbons wherein the additional ring(s) of the polycyclic hydrocarbon may be aromatic or nonaromatic.

The term "aryloxy group" may refer to an aryl group that is linked via an oxygen, and the aryl group is the same as described above.

The "arylalkyl group" may refer to an aryl group where one hydrogen is substituted with a lower alkylene, e.g., methylene, ethylene, and/or propylene. For example, the "arylalkyl group" may be a benzyl group or a phenylethyl group.

The term "cycloalkyl group" may refer to a monovalent functional group having one or more saturated rings in which all ring members are carbon, e.g., a cyclopentyl group and a cyclohexyl group.

The term "cycloalkenyl group" may refer to a monovalent functional group including at least one ring having a carbon-carbon double bond, wherein all ring members are carbon, e.g., a cyclopentenyl group or a cyclohexenyl group.

The term "cycloalkynyl group" may refer to a stabilized aliphatic monocyclic or polycyclic functional group including at least one carbon-carbon triple bond.

The term "heteroarylalkyl group" may refer to the alkyl group defined above where at least one hydrogen is substituted with a heteroaryl group.

The term "alkylheteroaryl group" may refer to the heteroaryl group defined above where at least one hydrogen is substituted with an alkyl group.

As used herein, when a definition is not otherwise provided, the term "aromatic ring" refers to a functional group in which all atoms in the cyclic functional group have a p-orbital, wherein these p-orbitals are conjugated. For example, the aromatic ring may be a $C_6$ to $C_{20}$ aryl group.

As used herein, when a definition is not otherwise provided, the term "heteroaromatic ring" refers to a functional group including a heteroatom selected from N, O, and S in a ring in which all atoms in the cyclic functional group have a p-orbital, wherein the p-orbital is conjugated. For example, the heteroaromatic ring may be a $C_2$ to $C_{20}$ heteroaryl group.

As used herein, when a definition is not otherwise provided, the term "alicyclic ring" may refer to non-conjugated ring, for example, a $C_3$ to $C_{20}$ cycloalkyl group, a $C_3$ to $C_{20}$ heterocycloalkyl group, a $C_3$ to $C_{20}$ cycloalkenyl group, and/or a $C_3$ to $C_{20}$ heterocycloalkenyl group.

As used herein, when a definition is not otherwise provided, the term "substituted" means that a compound or group is substituted with at least one substituent selected independently from —F, —Cl, —Br, —I, a $C_1$ to $C_{30}$ linear or branched alkyl group, for example, a $C_1$ to $C_{10}$ linear or branched alkyl group, $C_2$ to $C_{30}$ linear or branched alkenyl group, for example, a $C_2$ to $C_{10}$ linear or branched alkenyl group, a $C_2$ to $C_{30}$ linear or branched alkynyl group, for example, a $C_2$ to $C_{10}$ linear or branched alkynyl group, a $C_6$ to $C_{30}$ aryl group, for example, a $C_6$ to $C_{12}$ aryl group, a $C_2$ to $C_{30}$ heteroaryl group, for example, a $C_2$ to $C_{12}$ heteroaryl group, a $C_3$ to $C_{30}$ cycloalkyl group, a $C_1$ to $C_{20}$ fluoroalkyl group, a $C_1$ to $C_{20}$ perfluoroalkyl group ($C_nF_{2n+1}$), a $C_1$ to $C_{30}$ linear or branched alkoxy group, a $C_3$ to $C_{30}$ cycloalkoxy group, a $C_2$ to $C_{30}$ linear or branched alkoxyalkyl group, a $C_4$ to $C_{30}$ cycloalkoxyalkyl group, a cyano group, —NRR', wherein each of R and R' are independently one of hydrogen and a $C_1$ to $C_{10}$ alkyl group, —C(=NH)NH$_2$, a nitro group (—NO$_2$), an amide group (—C(=O)N(H)R, wherein R is hydrogen or a $C_1$ to $C_{10}$ alkyl group), an aldehyde group (—C(=O)H), a hydroxyl group (—OH), —S(=O)$_2$R, wherein R is one of hydrogen and a $C_1$ to $C_{10}$ alkyl group, and —NH$_2$C(=O)OR, wherein R is a $C_1$ to $C_{10}$ alkyl group, instead of hydrogen, provided that the substituted atom's normal valence is not exceeded.

Hereinafter, a thin film transistor according to example embodiments is described.

A thin film transistor according to example embodiments includes a gate electrode, a semiconductor overlapping the gate electrode, an insulator between the gate electrode and the semiconductor, and a source electrode and a drain electrode electrically connected to the semiconductor, where the semiconductor being an organic semiconductor capable of being applied by a solution process, where the insulator including an inorganic insulating layer, and a surface of the inorganic insulating layer disposed close to the organic semiconductor being coated with a polysiloxane having an acrylic terminal group.

As mentioned above, as an organic material for a channel of a thin film transistor (TFT), low-molecular-weight organic material, e.g., pentacene, may have a relatively high charge mobility of about 3.2 to about 5.0 cm$^2$/Vs or more, but may require a relatively expensive apparatus for vacuum deposition at the time of forming a thin film.

Meanwhile, in the case of polymer or oligomer organic materials, e.g., F8T2 (poly(9,9-dioctylfluorene-co-bithiophene)) as a polythiophene-based material, a solution process, e.g., spin casting, may be desirably applied. However, as for the organic semiconductor material capable of being applied by a solution process, a surface treatment between the insulator and the organic material may be required for improving crystallinity of a thin film of the organic semiconductor formed on the insulator in order to enhance charge mobility of the organic TFT, as well as for improving reliability of a device by covering defects due to a dangling bond of a surface of an insulator.

As for the surface treatment, a method of using an insulating film of an oxide, including, for example, SiO$_2$, SiN$_x$, Al$_2$O$_3$, etc., and forming a self-assembled monolayer on a surface of the insulator has been known. In order to form a self-assembled monolayer on a surface of the insulator, a surface of an insulator may first be activated by treating O$_2$ plasma, UV ozone, etc., and immersing the activated insulator in a solution including a surface treatment agent, including, for example, a silane-based agent, in a solvent, including, for example, hexane, toluene, etc., for a given or predetermined time, whereby a self-assembled monolayer may be formed on a surface of the insulator. Thus formed self-assembled monolayer may reduce or prevent a dangling bond of a surface of an oxide from being exposed, and thus may improve the properties of an interface between the insulator and organic semiconductor to enhance reliability of a device, as well as improving charge mobility of a TFT device by increasing crystallinity of molecules of an organic semiconductor deposited on the TFT.

However, homogeneously forming a self-assembled monolayer of low-molecular-weight silane based material on a surface of a large substrate is difficult, and may require complicated conditions and environment of process. Further, as it is necessary to immerse a substrate in a solution, a larger reactor may be required for a larger substrate, and a longer time may be required to form a self-assembled monolayer on the substrate. Further, using an organic solvent for low-molecular-weight silane material, including, for example, toluene, hexane, etc., may harm to environment. In addition, forming a thin film of an organic semiconductor by a solution process, not by a deposition method, may be difficult as the organic semiconductor may not wet a surface of a substrate due to a low surface energy thereof.

According to example embodiments, a surface treatment agent for an insulator may include a polysiloxane having an acrylic terminal group. That is, according to example embodiments, a thin film transistor includes an insulator having an inorganic insulating layer, where a surface of the inorganic insulating layer on which an organic semiconductor is formed being coated with a polysiloxane having an acrylic terminal group.

The polysiloxane having an acrylic terminal group may form a homogeneous thin layer by a solution process, and thus can be simply spin coated on an insulator to form a thin layer. In the case when a self-assembled monolayer of low-molecular-weight alkyl silane material is formed, an organic semiconductor does not wet the surface of an insulator formed with the self-assembled monolayer of low-molecular-weight alkyl silane material due to a very low surface energy of the insulator. Therefore, obtaining a homogeneous organic semiconductor thin layer on the insulator may be difficult. On the contrary, as the polysiloxane having an acrylic terminal group has an appropriate surface energy, i.e., about 80° to about 90°, based on the contact angle of water and a desirable wetting property, a homogeneous organic semiconductor thin layer may be formed on the insulator coated with the polysiloxane by a solution process.

Accordingly, by using a polysiloxane having an acrylic terminal group as a surface treatment agent of a surface of an insulator, an organic semiconductor may be applied by a solution process, which improves processibility of manufacturing an organic thin film transistor. Further, the resulted thin layer of an organic semiconductor may have increased crystallinity to improve charge mobility of a TFH, and the polysiloxane may cover defects due to dangling bonds of an oxide of the insulator to enhance reliability of the TFT device.

According to example embodiments, the polysiloxane having an acrylic terminal group may be represented by Chemical Formula 2:

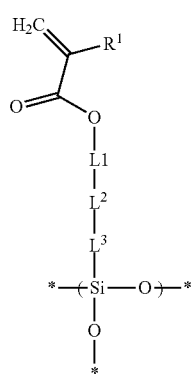

[Chemical Formula 2]

In Chemical Formula 2, $R^1$ may be hydrogen, or a substituted or unsubstituted $C_1$ to $C_{20}$ alkyl group, each of $L^1$ and $L^3$ may be independently one of a substituted or unsubstituted $C_1$ to $C_{20}$ alkylene group, a substituted or unsubstituted $C_6$ to $C_{20}$ arylene group, a substituted or unsubstituted $C_3$ to $C_{20}$ cycloalkylene group, a substituted or unsubstituted $C_2$ to $C_{20}$ alkenylene group, a substituted or unsubstituted $C_2$ to $C_{20}$ alkynylene group, —R—O—R'—, —R—N—R'—, —R—(C=O)—R'— (wherein, each of R and R' are independently $C_1$ to $C_{10}$ hydrocarbon radical), and a combination thereof, $L^2$ may be one of —O—(C=O)—NR"—, —(C=O)—NR"— (wherein, R" is one of hydrogen and a $C_1$ to $C_6$ hydrocarbon radical), —O—, —COO—, and —S—, and

* is a portion linked to an adjacent molecule.

In an example, $R^1$ may be hydrogen or methyl group, for example, may be hydrogen, each of $L^1$ and $L^3$ may be independently a $C_1$ to $C_{20}$ alkylene group, for example, ethylene group or propylene group, and $L^2$ may be —(C=O)—NR"— (wherein, R" is one of hydrogen and a $C_1$ to $C_6$ hydrocarbon radical).

The polysiloxane having an acrylic terminal group represented by Chemical Formula 2 may be coated on a surface of an insulator, and then may be photo cross-linked by the terminal acrylic groups to form a denser net structure.

The polysiloxane having an acrylic terminal group represented by Chemical Formula 2 may be coated on a surface of an inorganic insulator to have a thickness of about 10 nanometers to about 50 nanometers.

Meanwhile, an organic semiconductor capable of being applied on an insulator coated with a polysiloxane having an acrylic terminal group by a solution process according to example embodiments may be any organic semiconductor without limitation, as long as it can be that can be applied by a solution process, and may be, for example, a semiconductor represented by Chemical Formula 1, which shows relatively high charge mobility:

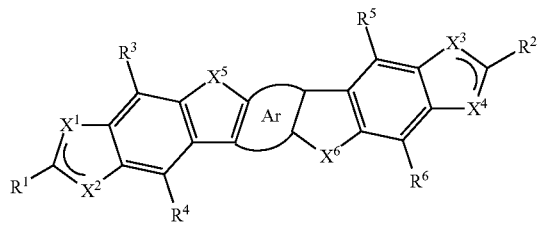

[Chemical Formula 1]

In the above Chemical Formula 1,

Ar is a substituted or unsubstituted $C_6$ to $C_{30}$ aromatic cyclic group,

Each of $X^1$ to $X^4$ are independently one of O, S, Se, Te, N—$R^a$, and $CR^b$, wherein each of $R^a$ and $R^b$ are independently one of hydrogen, a substituted or unsubstituted linear or branched $C_1$ to $C_{30}$ alkyl group, for example, a substituted or unsubstituted linear or branched $C_1$ to $C_{20}$ alkyl group, a substituted or unsubstituted $C_7$ to $C_{30}$ arylalkyl group, for example, a substituted or unsubstituted $C_7$ to $C_{20}$ arylalkyl group, a substituted or unsubstituted $C_6$ to $C_{30}$ aryl group, for example, a substituted or unsubstituted $C_6$ to $C_{20}$ aryl group, a substituted or unsubstituted $C_1$ to $C_{30}$ alkoxy group, for example, a substituted or unsubstituted $C_1$ to $C_{20}$ alkoxy group, a substituted or unsubstituted $C_6$ to $C_{30}$ aryloxy group, for example, —$OR^{11}$, wherein $R^{11}$ is a substituted or unsubstituted $C_6$ to $C_{30}$ aryl group, for example, a substituted or unsubstituted $C_6$ to $C_{20}$ aryl group, a substituted or unsubstituted $C_4$ to $C_{30}$ cycloalkyl group, for example, a substituted or unsubstituted $C_4$ to $C_{20}$ cycloalkyl group, a substituted or unsubstituted $C_4$ to $C_{30}$ cycloalkyloxy group, for example, —$OR^{12}$, wherein $R^{12}$ is a substituted or unsubstituted $C_4$ to $C_{30}$ cycloalkyl group, for example, a substituted or unsubstituted $C_4$ to $C_{20}$ cycloalkyl group, a substituted or unsubstituted $C_2$ to $C_{30}$ heteroaryl group, for example, a substituted or unsubstituted $C_2$ to $C_{20}$ heteroaryl group, —C(=O)$R^{13}$, wherein $R^{13}$ is a substituted or unsubstituted $C_1$ to $C_{30}$ alkyl group, for example, a $C_1$ to $C_{20}$ alkyl group, —S(=O)$_2R^{14}$, wherein $R^{14}$ is a substituted or unsubstituted $C_1$ to $C_{30}$ alkyl group, for example, a $C_1$ to $C_{20}$ alkyl group, and —NHC(=O)O$R^{15}$, wherein $R^{15}$ is a substituted or unsubstituted $C_1$ to $C_{30}$ alkyl group, for example, a substituted or unsubstituted $C_1$ to $C_{20}$ alkyl group, at least one of $X^1$ and $X^2$ is selected from O, S, Se, Te, and N—$R^a$, at least one of $X^3$ and $X^4$ is selected from O, S, Se, Te, and N—$R^a$, each of $X^5$ and $X^6$ are independently one of O, S, Se, Te, N—$R^a$, and C$R^bR^c$ wherein each of $R^a$ to $R^c$ are independently one of hydrogen, a substituted or unsubstituted linear or branched $C_1$ to $C_{30}$ alkyl group, for example, a substituted or unsubstituted linear or branched $C_1$ to $C_{20}$ alkyl group, a substituted or unsubstituted $C_7$ to $C_{30}$ arylalkyl group, for example, a substituted or unsubstituted $C_7$ to $C_{20}$ arylalkyl group, a substituted or unsubstituted $C_6$ to $C_{30}$ aryl group, for example, a substituted or unsubstituted $C_6$ to $C_{20}$ aryl group, a substituted or unsubstituted $C_1$ to $C_{30}$ alkoxy group, for example, a substituted or unsubstituted $C_1$ to $C_{20}$ alkoxy group, a substituted or unsubstituted $C_6$ to $C_{30}$ aryloxy group, for example, —O$R^{11}$, wherein $R^{11}$ is a substituted or unsubstituted $C_6$ to $C_{30}$ aryl group, for example, a $C_6$ to $C_{20}$ aryl group, a substituted or unsubstituted $C_4$ to $C_{30}$ cycloalkyl group, for example, a substituted or unsubstituted $C_4$ to $C_{20}$ cycloalkyl group, a substituted or unsubstituted $C_4$ to $C_{30}$ cycloalkyloxy group, for example, —O$R^{12}$, wherein $R^{12}$ is a substituted or unsubstituted $C_4$ to $C_{30}$ cycloalkyl group, for example, a substituted or unsubstituted $C_4$ to $C_{20}$ cycloalkyl group, a substituted or unsubstituted $C_2$ to $C_{30}$ heteroaryl group, for example, a substituted or unsubstituted $C_2$ to $C_{20}$ heteroaryl group, —C(=O)$R^{13}$, wherein $R^{13}$ is a substituted or unsubstituted $C_1$ to $C_{30}$ alkyl group, for example, a substituted or unsubstituted $C_1$ to $C_{20}$ alkyl group, —S(=O)$_2R^{14}$, wherein $R^{14}$ is a substituted or unsubstituted $C_1$ to $C_{30}$ alkyl group, for example, a substituted or unsubstituted $C_1$ to $C_{20}$ alkyl group, and —NHC(=O)O$R^{16}$, wherein $R^{15}$ is a substituted or unsubstituted $C_1$ to $C_{30}$ alkyl group, for example, a substituted or unsubstituted $C_1$ to $C_{20}$ alkyl group, and each of $R^1$ to $R^6$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, for example, a substituted or unsubstituted linear or branched $C_2$ to $C_{20}$ alkynyl group, a substituted or unsubstituted $C_7$ to $C_{30}$ arylalkyl group, for example, a substituted or unsubstituted $C_7$ to $C_{20}$ arylalkyl group, a substituted or unsubstituted $C_2$ to $C_{30}$ heteroarylalkyl group, for example, a substituted or unsubstituted $C_2$ to $C_{20}$ heteroarylalkyl group, a substituted or unsubstituted $C_2$ to $C_{30}$ alkylheteroaryl group, for example, a substituted or unsubstituted $C_2$ to $C_{20}$ alkylheteroaryl group, a substituted or unsubstituted $C_5$ to $C_{30}$ cycloalkyl group, for example, a substituted or unsubstituted $C_5$ to $C_{20}$ cycloalkyl group, a substituted or unsubstituted $C_2$ to $C_{30}$ heterocycloalkyl group, for example, a substituted or unsubstituted $C_2$ to $C_{20}$ heterocycloalkyl group, a substituted or unsubstituted $C_6$ to $C_{30}$ aryl group, for example, a substituted or unsubstituted $C_6$ to $C_{20}$ aryl group, and a substituted or unsubstituted $C_2$ to $C_{30}$ heteroaryl group, for example, a substituted or unsubstituted $C_2$ to $C_{20}$ heteroaryl group.

The organic semiconductor compound represented by the above Chemical Formula 1 has a structure in which seven or more aromatic rings and heteroaromatic rings are fused. By having a compact planar molecular structure, the fused polycyclic heteroaromatic compound has a uniform and stable oxidation potential when applied to an actual device and shows higher charge mobility because the intermolecular packing and stacking are improved. Thereby, the fused polycyclic heteroaromatic compounds may be more easily synthesized to be effectively applied to a semiconductor material and/or an electron transporting material. In other words, benzene rings are positioned at both sides in the center of two rings containing $X^5$ and $X^6$ linked by an aromatic ring (Ar), and an $X^1$ and $X^2$-containing hetero-ring and an $X^3$ and $X^4$-containing hetero-ring are condensed with the benzene rings in Chemical Formula 1, and thereby the conjugation structure is enlarged and the intermolecular interaction is enhanced.

In addition, by positioning a hetero-ring between benzene rings, the solubility of the fused polycyclic heteroaromatic compound for the organic solvent may be improved. By introducing a $C_{10}$ to $C_{30}$ long aliphatic chain group (e.g., a substituted or unsubstituted $C_{10}$ to $C_{30}$ alkyl group or a substituted or unsubstituted $C_{10}$ to $C_{30}$ alkenyl group) into $R^1$ to $R^6$, solubility of the fused polycyclic heteroaromatic compound for the organic solvent may be improved. Due to the solubility improvement, the fused polycyclic heteroaromatic compound may be simply coated by a solution process at room temperature as well as in a deposition process, and the thin film may be formed in a relatively wide area so the processibility and the workability are improved.

In the above Chemical Formula 1, the same atom at each of $X^1$ and $X^4$, and $X^2$ and $X^3$ may be positioned symmetrically to each other and therefore the packing or stacking characteristics may be enhanced.

In the above Chemical Formula 1, one of $X^1$ and $X^2$ and one of $X^3$ and $X^4$ may be a selenium atom (Se), and one of $X^5$ and $X^6$ may by sulfur atom (S).

In the above Chemical Formula 1, Ar may be substituted or unsubstituted benzene, substituted or unsubstituted naphthalene, or substituted or unsubstituted anthracene, and each of $R^1$ and $R^2$ may be independently a $C_1$ to $C_{30}$ alkyl group.

The organic semiconductor compound may be one of the fused polycyclic heteroaromatic compounds represented by the following Chemical Formulae 1A to 1G.

[Chemical Formula 1A]

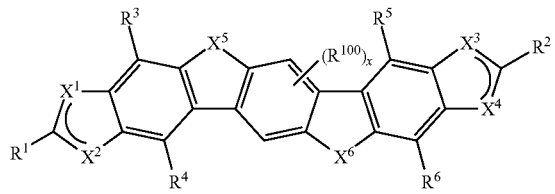

[Chemical Formula 1B]

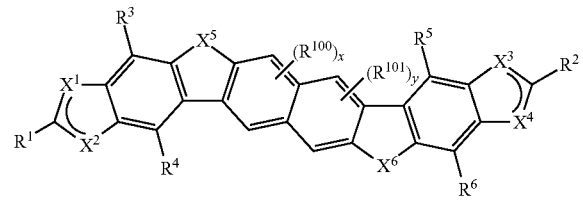

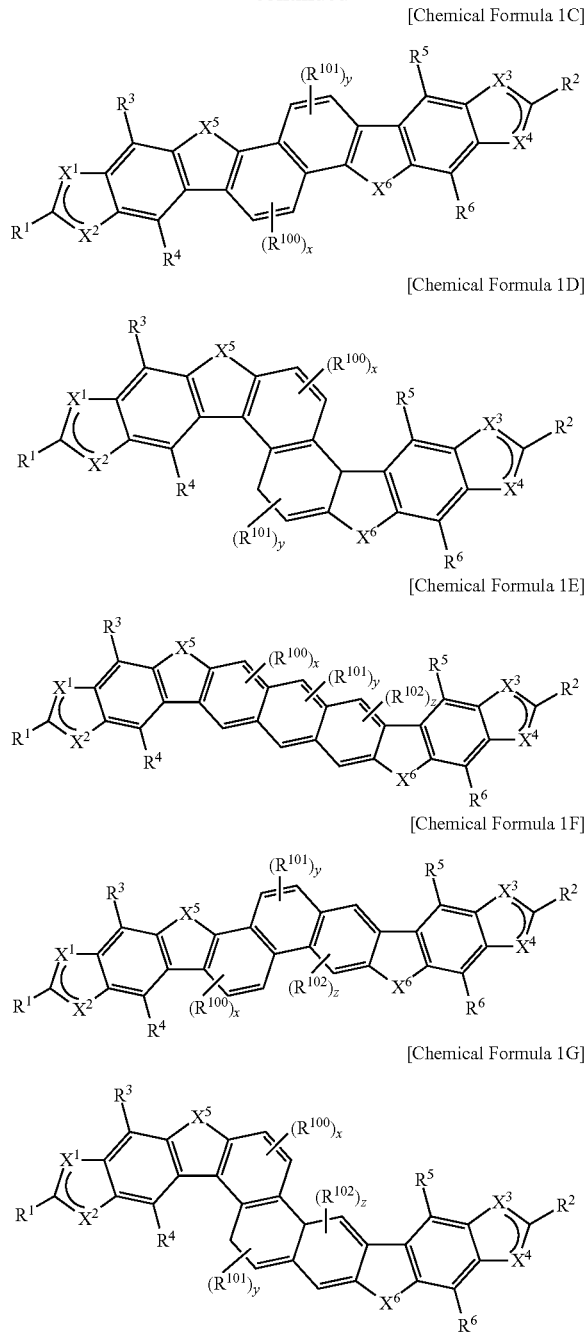

[Chemical Formula 1C]

[Chemical Formula 1D]

[Chemical Formula 1E]

[Chemical Formula 1F]

[Chemical Formula 1G]

In the above Chemical Formulae 1A to 1G, each of $X^1$, $X^2$, $X^3$, $X^4$, $X^5$, $X^6$, $R^1$, $R^2$, $R^3$, $R^4$, $R^5$, and $R^6$ are the same as in Chemical Formula 1, each of $R^{100}$ to $R^{102}$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group, and each of x, y, and z are integers of 1 or 2.

In the above Chemical Formulae 1A to 1G, one of $X^1$ and $X^2$ and one of $X^3$ and $X^4$ may be selenium atom (Se), and one of $X^5$ and $X^6$ may be sulfur atom (S).

In example embodiments, the organic semiconductor compound may be a fused polycyclic heteroaromatic compound represented by the above Chemical Formula 1A, where one of $X^1$ and $X^2$ and one of $X^3$ and $X^4$ may be selenium atom (Se), one of $X^5$ and $X^6$ may be sulfur atom (S), and each of $R^1$ to $R^6$ may be independently a linear or branched $C_1$ to $C_{30}$ alkyl group, a linear or branched $C_2$ to $C_{30}$ alkenyl group, a linear or branched $C_2$ to $C_{30}$ alkynyl group, or a $C_7$ to $C_{30}$ arylalkyl group. In the compound represented by Chemical Formula 1A, when each of $R^1$ to $R^6$ has the above substituent, the solubility of the compound in an organic solvent may further increase and be appropriate to be used in a solution process.

For example, the compound of the above Chemical Formula 1 may be obtained by a cyclization reaction of an intermediate compound of the following Chemical Formula 1-1. The cyclization reaction may be performed by the method described in, for example, J. Org. Chem. 2005, 70, 4502-4505.

[Chemical Formula 1-1]

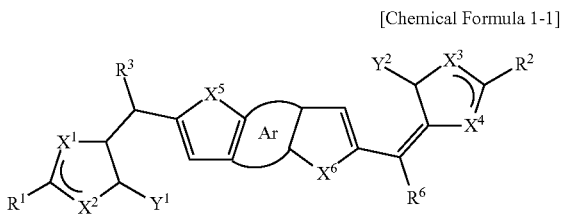

In the above Chemical Formula 1-1, each of $X^1$, $X^2$, $X^3$, $X^4$, $X^5$, $X^6$, $R^1$, $R^2$, $R^3$, and $R^6$ are the same as in Chemical Formula 1, $Y^1$ is an acyl group (—C(═O)$R^4$, wherein $R^4$ is the same as in the Chemical Formula 1) or a halogen (e.g., —Br), and $Y^2$ is an acyl group (—C(═O)$R^5$, wherein $R^5$ is the same as in the Chemical Formula 1) or a halogen (e.g., —Br). For example, the fused polycyclic heteroaromatic compound may be synthesized according to the following Reaction Scheme 1, but is not specifically limited thereto.

[Reaction Scheme 1]

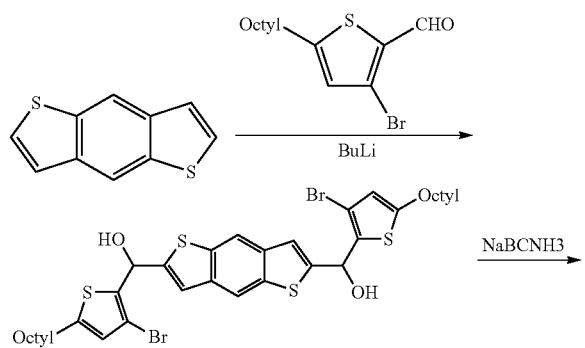

-continued

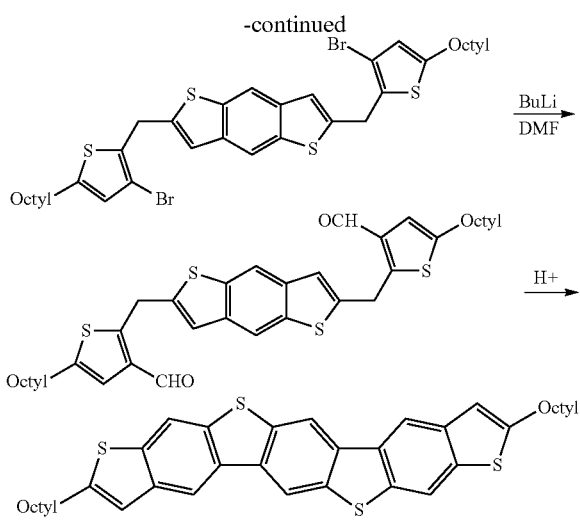

Reaction Scheme 1 may be performed using a heteroaromatic ring compound substituted with bromine at about −78° C. to room temperature (about 23° C. to about 25° C.) while being exposed to air or a nitrogen atmosphere. The solvent may include the commonly used toluene, dimethyl formamide, N-methylpyrrolidinone, and/or tetrahydrofuran. The catalyst for dehydration in the last step may be an acidic catalyst (e.g., Amberlyst® 15 (manufactured by Sigma-Aldrich)).

A person of ordinary skill in the art may adjust the molecular weight of the fused polycyclic heteroaromatic compound obtained from the synthesis according to example embodiments depending upon the usage and the case, for example, the molecular weight is about 350 to about 3000.

An organic thin film may be manufactured by depositing the fused polycyclic heteroaromatic compound on a substrate according to the general method or dissolving the fused polycyclic heteroaromatic compound in an organic solvent and then coating the same at room temperature according to a solution process. If required, heating treatment may be performed after the deposition or coating process to further enhance the densification and uniformity of the thin film.

The method of providing an organic thin film may include thermal deposition, vacuum deposition, laser deposition, screen printing, printing, imprinting, spin casting, dipping, ink jetting, roll coating, flow coating, drop casting, spray coating, and/or roll printing, but is not limited thereto. The heat treatment may be performed at about 80° C. to about 250° C. for about 1 minute to about 2 hours, but is not limited thereto.

A thickness of the organic thin film may be adjusted according to the usage and the case considering the types of the used compound and solvent by a person of ordinary skill in the art, for example, in a range of about 200 Å to about 10,000 Å.

The organic solvent may include at least one type of general organic solvent, for example, at least one type of an aliphatic hydrocarbon solvent (e.g., hexane or heptane); an aromatic hydrocarbon solvent (e.g., toluene, pyridine, quinoline, anisole, mesitylene or xylene); a ketone-based solvent (e.g., methyl isobutyl ketone, 1-methyl-2-pyrrolidinone, cyclohexanone, or acetone); an ether-based solvent (e.g., tetrahydrofuran or isopropyl ether); an acetate-based solvent (e.g., ethyl acetate, butyl acetate, or propylene glycol methyl ether acetate); an alcohol-based solvent (e.g., isopropyl alcohol or butanol); an amide-based solvent (e.g., dimethyl acetamide or dimethyl formamide); a silicone-based solvent; and a mixture of foregoing solvents. The amount of the fused polycyclic heteroaromatic compound dissolved in the organic solvent may be adequately selected and determined by a person of ordinary skill in the art, for example, in a range of about 0.01 wt % to about 50 wt % in the total solvent in view of the solubility and a coating property.

Hereinafter, a thin film transistor according to example embodiments is explained in detail referring to the drawings annexed to the specification.

FIG. 1 is a cross-sectional view showing a thin film transistor according to example embodiments.

Referring to FIG. 1, substrate 1 that also acts as a gate electrode is shown.

Substrate 1 may be formed by, for example, transparent glass, silicon, polymer, etc. As described later in the Examples, a gate electrode is formed by forming thermally grown $SiO_2$ on a highly doped silicon (Si) substrate. The gate electrode, which is a doped Si substrate, is connected to a gate line (not shown) transmitting a gate signal.

Insulator 3 is formed on substrate 1 that also acts as a gate electrode. As described above, the gate insulator includes inorganic insulating layer 3, and a surface of the inorganic insulating layer 3 that faces an organic semiconductor 5 is coated with polysiloxane coating 4 having an acrylic terminal group. Inorganic insulating layer 3 may be formed by inorganic material, including, for example, $SiO_x$, $SiN_x$, $AlO_x$, etc.

Polysiloxane coating 4 having an acrylic terminal group may be formed by the polysiloxane having an acrylic terminal group represented by the above Chemical Formula 2.

Organic semiconductor 5 is formed on polysiloxane coating 4 having an acrylic terminal group. Organic semiconductor 5 is disposed in a position overlapping with substrate 1, which also acts as a gate electrode, via the gate insulating layer 3, in a shape, for example, as an island.

As described above, organic semiconductor 5 may include any organic semiconductor capable of being applied by a solution process, and is not specifically limited. In example embodiments, organic semiconductor 5 may include the compound represented by the above Chemical Formula 1, of a compound selected from any one of the fused polycyclic heteroaromatic compounds represented by Chemical Formulae 1A to 1G. The fused polycyclic heteroaromatic compound may have a high solubility in an organic solvent by adjusting the substituents of the compound. Accordingly, the fused polycyclic heteroaromatic compound may be easily coated on polysiloxane coating 4 having an acrylic terminal group formed on inorganic insulating layer 3.

Source electrode 6 and drain electrode 7 are respectively positioned at each end of organic semiconductor 5, and are electronically connected to organic semiconductor 5. In this case, the expression "electronically connected" means not only the case where source electrode 6 and drain electrode 7 are directly connected to organic semiconductor 5, but also the case where a conductive or semiconductive material is disposed between source electrode 6 and drain electrode 7.

As described above, a thin film transistor according to example embodiments is in a top contact structure, where source electrode 6 and drain electrode 7 are respectively electronically connected to organic semiconductor 5 on the organic semiconductor. In the top contact structure, compared with the bottom contact structure where source electrode and drain electrode are respectively electronically connected to organic semiconductor below the organic semiconductor, a channel for the organic semiconductor may further be stabilized by ensuring continuity of the organic semiconductor. Further, as the material for forming a source electrode and a drain electrode is directly deposited on the organic semiconductor layer in vacuum state, a contact resistance between the organic semiconductor and the source and drain electrodes may be reduced, contrary to the case where an organic semiconductor layer is formed after depositing and patterning the source and drain electrodes.

The thin film transistor according to example embodiments may be applied to various electronic devices, including, for example, a semiconductor device, a flat display device, an energy device, a sensor, etc. The electronic device may include, for example, a liquid crystal display device, an organic light-emitting diode, a solar cell, an organic sensor, etc.

Hereinafter, a method for manufacturing a thin film transistor shown in FIG. 1 is explained in detail.

First, thermally grown $SiO_2$ is formed on a highly doped Si substrate 1 to form a gate electrode. On the gate electrode (substrate 1), inorganic insulating layer 3 as an insulator is formed. Inorganic insulating layer 3 may be formed by depositing an oxide of Si, nitride of Si, oxide of Al, etc., in a thickness of about 100 nanometers to about 500 nanometers, for example, about 200 nanometers to about 400 nanometers, for example, about 250 nanometers to about 350 nanometers, for example, about 280 nanometers to about 330 nanometers, by using PECVD or ALD.

Subsequently, a surface of inorganic insulating layer 3 may be activated by $O_2$ plasma process, and polysiloxane having an acrylic terminal group is coated on the activated surface by using, for example, a spin coating, to form a layer. For example, solution of a polysiloxane having an acrylic terminal group may be coated on the inorganic insulating layer 3, soft-baked, i.e., heat-treated at about 70° C. for about 5 to 10 minutes, irradiated with UV at 248 nanometers of 500 $mJ/cm^2$, and hard-baked, i.e., heat-treated at about 185° C. for about 1 hour to cure the polysiloxane having an acrylic terminal group. The cured polysiloxane coating may have a thickness of about 10 nanometers to about 50 nanometers, for example, about 15 nanometers to about 45 nanometers, for example, about 20 nanometers to about 40 nanometers, for example, about 25 nanometers to about 35 nanometers.

A solution of organic semiconductor 5 may be coated on the polysiloxane coating 4. Organic semiconductor 5 may be formed by forming a solution of a compound represented by the above Chemical Formula 1 or by any one of Chemical Formulae 1A to 1G, and coating the solution on the polysiloxane coating 4 by a gap casting method.

After forming organic semiconductor layer 5, source electrode 6 and drain electrode 7 may be formed on each end of the organic semiconductor by using Vacuum Thermal Evaporation, Sputtering, e-Bean evaporation method, etc., to form a TFT shown in FIG. 1. As for the source electrode 6 and drain electrode 7, generally used metal, such as, for example, Au, Ag, Al, Ni, ITO, etc., may be used, but is not limited thereto.

Hereinafter, the present disclosure is illustrated in more detail with reference to examples. However, these are examples, and the present disclosure is not limited thereto.

EXAMPLES

Manufacturing of Thin Film Transistor

Example 1

A gate electrode is formed by forming thermally grown $SiO_2$ on a highly doped Si substrate. Then, the surface of the $SiO_2$ is activated by $O_2$ plasma process of 100 Watts for 30 seconds. On the activated surface polysiloxane represented by Chemical Formula 3 is spin coated, and heat treatment is performed at 70° C. for 5 minutes.

Subsequently, Ultra Violet light at 248 nanometers of 500 $mJ/cm^2$ is irradiated, and heat treatment at 185° C. for 1 hour is performed to cure the polysiloxane resin having a thickness of 20 nanometers.

Then, the compound represented by Chemical Formula 4 is dissolved in 1,2-dichlorobenzene to have a concentration of 0.2 weight %, and the solution is coated by gap casting on the insulator coated with the polysiloxane resin to form a thin layer. After a thin layer of the organic semiconductor is formed, Au is deposited on each end of the layer of the organic semiconductor to have a thickness of 100 nanometers, respectively, by vacuum thermal evaporation to form a source electrode and a drain electrode on the layer of the organic semiconductor.

[Chemical Formula 3]

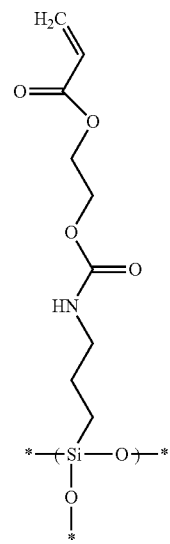

[Chemical Formula 4]

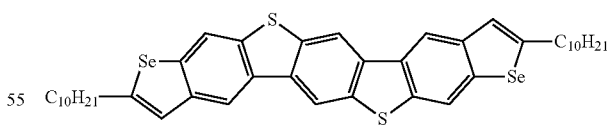

Comparative Example 1

A gate electrode is formed by forming thermally grown $SiO_2$ on a highly doped Si substrate. Then, the surface of the $SiO_2$ is activated by $O_2$ plasma process of 100 Watts for 30 seconds. The substrate having an activated surface is immersed in a solution formed by dissolving octadecyl trichlorosilane (ODTS) in hexane to have a concentration of 5 mM for 1 hour.

The substrate is removed from the solution, washed with hexane and ethanol to remove unreacted material, and heat-treated to have silane and radical groups completely react. Subsequently, the compound represented by the above Chemical Formula 4 is dissolved in 1,2-dichlorobenzene to form a solution having a concentration of 0.2 weight %, and the solution is coated by gap casting on the insulator coated with the acrylic polysiloxane resin to form a thin layer. However, in this case, as the surface energy of the surface coated with ODTS is too low for the organic semiconductor to be coated, a thin film transistor has not been manufactured.

Comparative Example 2

A gate electrode is formed by forming thermally grown $SiO_2$ on a highly doped Si substrate. Then, the surface of the $SiO_2$ is activated by $O_2$ plasma process of 100 Watts for 30 seconds. The substrate having an activated surface is immersed in a solution formed by diluting trimethoxy (2-phenylethyl) silane (PTS) with toluene to have a concentration of 5 mM for 1 hour.

The substrate is removed from the solution, washed with toluene and chloroform to remove unreacted material, and heat-treated to have silane and radical groups completely react. Subsequently, the compound represented by the above Chemical Formula 4 is dissolved in 1,2-dichlorobenzene to form a solution having a concentration of 0.2 weight %, and the solution is coated by gap casting on the insulator coated with the acrylic polysiloxane resin to form a thin layer. After a thin layer of the organic semiconductor is formed, Au is deposited on each end of the layer of the organic semiconductor to have a thickness of 100 nanometers, respectively, by vacuum thermal evaporation to form a source electrode and a drain electrode on the layer of the organic semiconductor.

Evaluation

Characteristics of the thin film transistors manufactured according to Example 1 and Comparative Example 2 are evaluated. As described above, in Comparative Example 1, as the surface energy of the surface coated with ODTS is too low, an organic semiconductor cannot be formed in a solution process.

The characteristics of a thin film transistor include insulation strength, charge mobility, $I_{on}/I_{off}$ ratio, etc.

Figure 2:
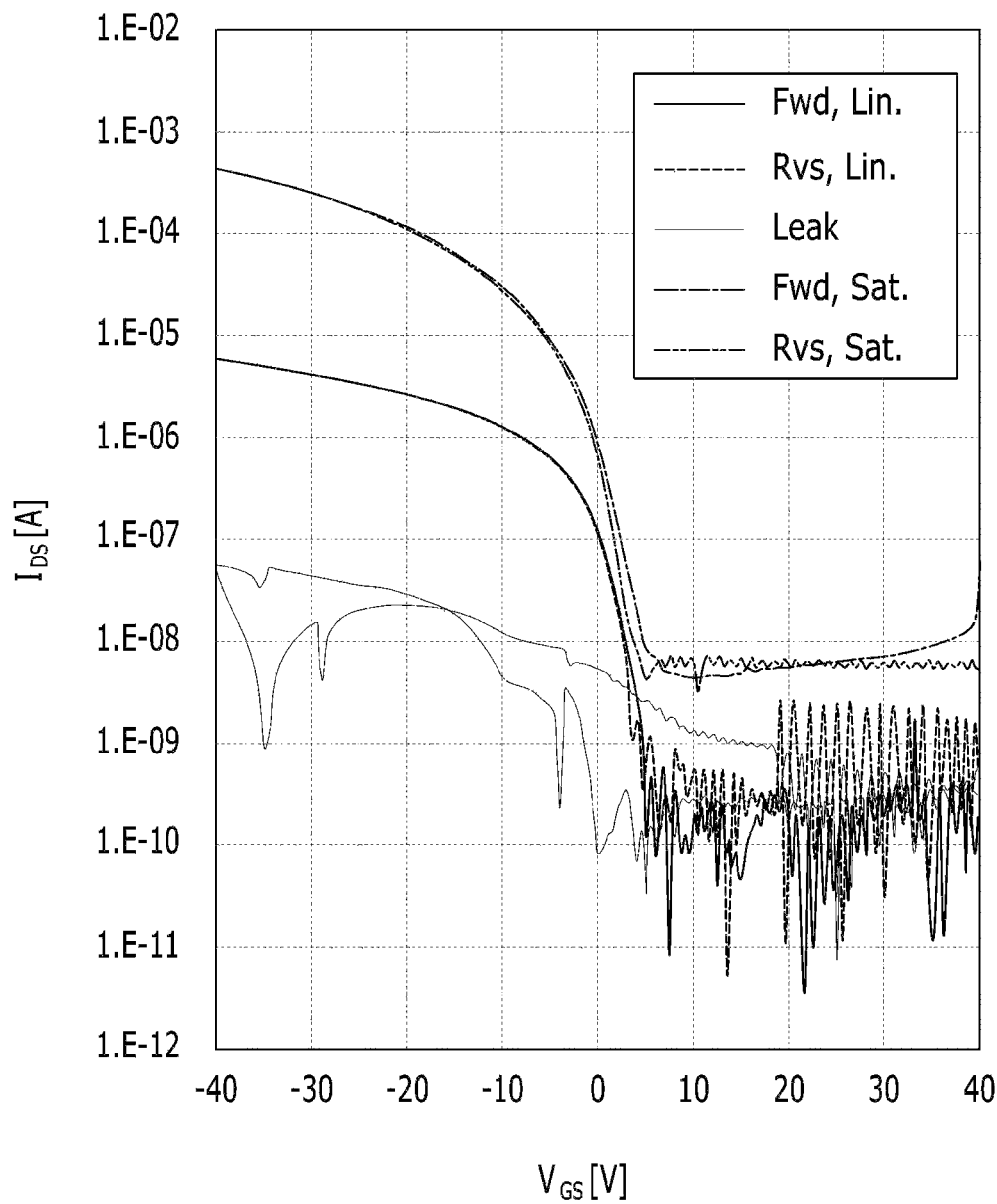
FIG. 2 is a graph showing charge mobility of a thin film transistor according to an Example 1.
Figure 3:
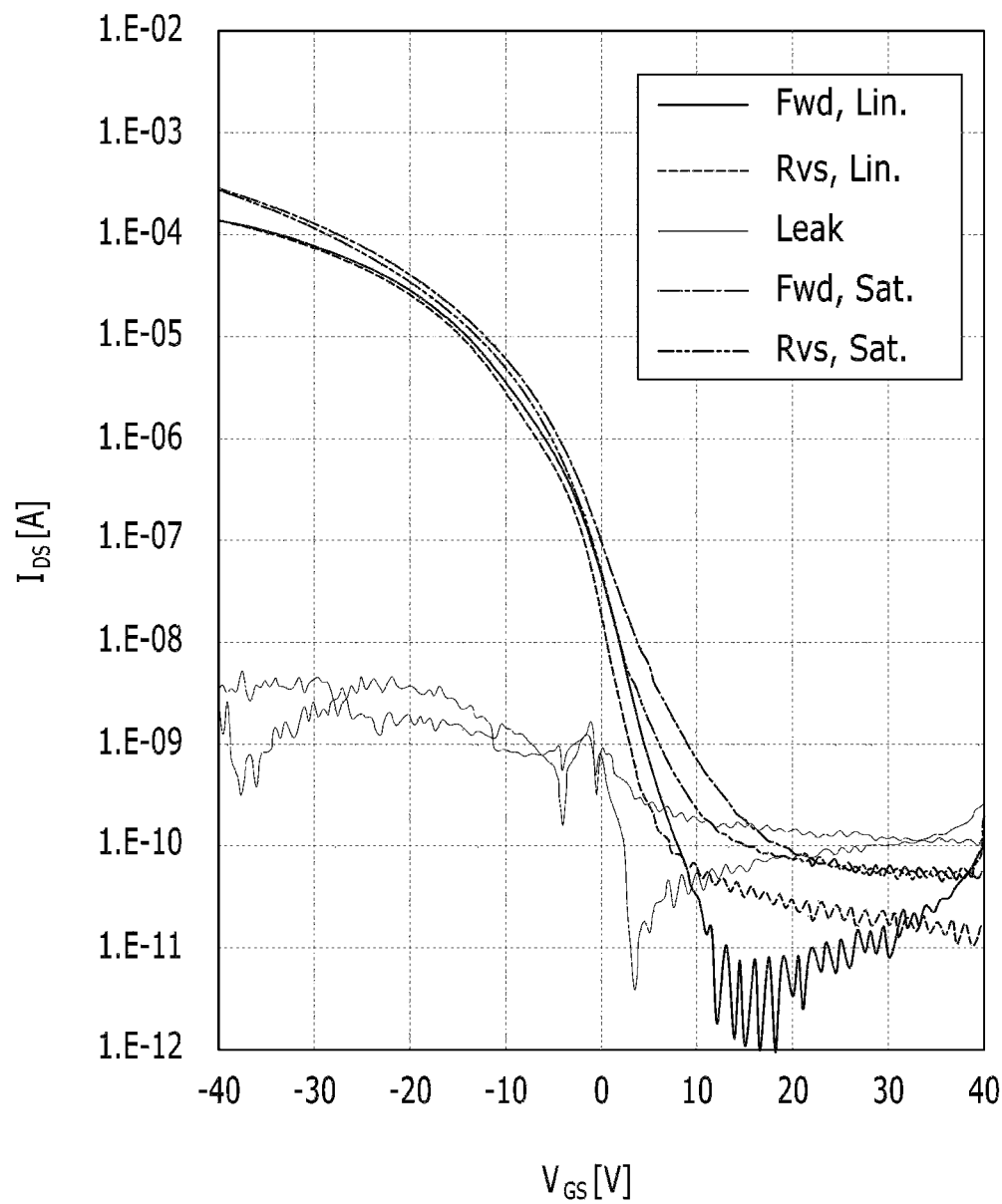
FIG. 3 is a graph showing charge mobility of a thin film transistor according to Comparative Example 2.

FIG. 2 is a graph showing charge mobility in the thin film transistor according to Example 1. FIG. 3 is a graph showing charge mobility in the thin film transistor according to Comparative Example 2.

The following Table 1 shows average charge mobility and on-current values of the thin film transistors according to Example 1 and Comparative Example 2.

TABLE 1

|  | Example 1 | Comparative Example 2 |
|---|---|---|
| Charge mobility (cm²/Vs) | 5.6 | 2.5 |
| on-current (A) | 4.39E−04 | 2.85E−04 |

Referring to FIGS. 2 and 3, the thin film transistor according to Example 1 exhibits sufficiently high charge mobility of 5.6 cm²/Vs, while the thin film transistor according to Comparative Example 2 shows relatively low charge mobility of 2.5 cm²/Vs, which is less than a half of the charge mobility of Example 1. That is, the THF according to Example 1 can be manufactured by a simple and easy method of using a solution process to apply organic semiconductor, while showing a sufficiently high charge mobility to be advantageously used as an organic insulator.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims. For example, while the example embodiments only illustrate insulator and thin film transistor including same, persons skilled in the art will understand that the cured material prepared from the composition according to example embodiments may be efficiently used in various articles and electronic materials.

What is claimed is:
1. A thin film transistor comprising:
a gate electrode;
an organic semiconductor overlapping the gate electrode;
an insulator between the gate electrode and the organic semiconductor, the insulator including an inorganic insulating layer having a surface facing the organic semiconductor, the inorganic insulating layer entirely comprising an inorganic material;
a coating on the surface of the inorganic insulating layer that faces the organic semiconductor, the coating having a polysiloxane having an acrylic terminal group; and
a source electrode and a drain electrode electrically connected to the organic semiconductor, respectively,
wherein the organic semiconductor is represented by Chemical Formula 1,

[Chemical Formula 1]

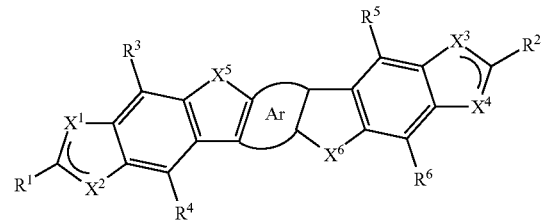

wherein, in Chemical Formula 1,
Ar is a substituted or unsubstituted $C_6$ to $C_{30}$ aromatic cyclic group,
each of $X^1$ to $X^4$ are independently one of O, S, Se, Te, N—$R^a$, and $CR^b$, wherein each of $R^a$ and $R^b$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —$OR^{11}$, wherein $R^{11}$ is a substituted or unsubstituted $C_6$ to $C_{30}$ aryl group, a substituted or unsubstituted $C_4$ to $C_{30}$ cycloalkyl group, —$OR^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2R^{14}$, wherein $R^{14}$ is a substituted or unsubstituted $C_1$ to $C_{30}$ alkyl group, and —NHC(=O)$OR^{15}$, wherein $R^{15}$ is a substituted or unsubstituted $C_1$ to $C_{30}$ alkyl group, at least one of $X^1$ and $X^2$ is selected from O, S, Se, Te, and N—$R^a$, at least one of $X^3$ and $X^4$ is selected from O, S, Se, Te, and N—$R^a$, each of $X^5$ and $X^6$ are independently one of O, S, Se, Te, N—$R^a$, and $CR^bR^c$, wherein each of $R^a$ to $R^c$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —$OR^{11}$, wherein $R^{11}$ is a substituted or unsubstituted $C_6$ to $C_{30}$ aryl group, a substituted or unsubstituted $C_4$ to $C_{30}$ cycloalkyl group, —$OR^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2R^{14}$, wherein $R^{14}$ is a substituted or unsubstituted $C_1$ to $C_{30}$ alkyl group, and —NHC(=O)$OR^{15}$, wherein $R^{15}$ is a substituted or unsubstituted $C_1$ to $C_{30}$ alkyl group, and each of $R^1$ to $R^6$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group, wherein the coating has a thickness of about 40 nanometers to about 50 manometers, and wherein the polysiloxane having an acrylic terminal group is represented by Chemical Formula 2,

[Chemical Formula 2]

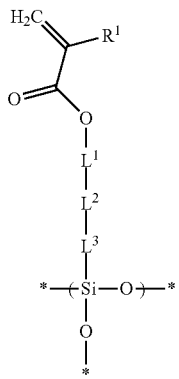

wherein, in Chemical Formula 2, $R^1$ is hydrogen or a substituted or unsubstituted $C_1$ to $C_{20}$ alkyl group, each of $L^1$ and $L^3$ are independently one of a substituted or unsubstituted $C_1$ to $C_{20}$ alkylene group, a substituted or unsubstituted $C_6$ to $C_{20}$ arylene group, a substituted or unsubstituted $C_6$ to $C_{20}$ cycloalkylene group, a substituted or unsubstituted $C_2$ to $C_{20}$ alkenylene group, a substituted or unsubstituted $C_2$ to $C_{20}$ alkynylene group, —R—O—R'—, —R—N—R'—, —R—(C=O)—R'— (wherein, each of R and R' are independently $C_1$ to $C_{10}$ hydrocarbon radical), and a combination thereof, $L^2$ is one of —O—(C=O)—NR"—, —(C=O)—NR"— (wherein, R" is one of hydrogen and a $C_1$ to $C_6$ hydrocarbon radical), —O—, —COO—, and —S—, and

* is a portion linked to an adjacent molecule.

2. The thin film transistor according to claim 1, wherein the organic semiconductor is one of fused polycyclic heteroaromatic compounds represented by the following Chemical Formulae 1A to 10,

[Chemical Formula 1A]

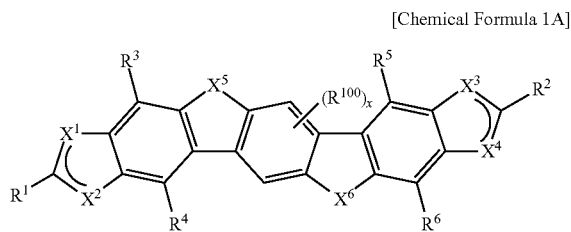

[Chemical Formula 1B]

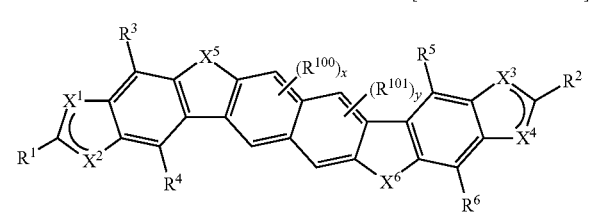

[Chemical Formula 1C]

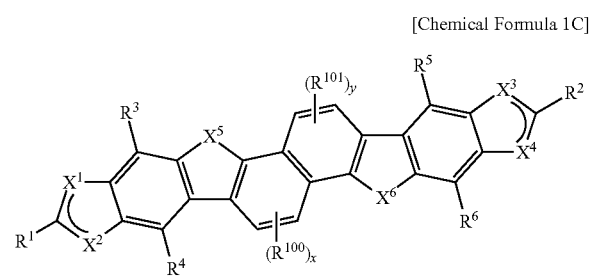

[Chemical Formula 1D]

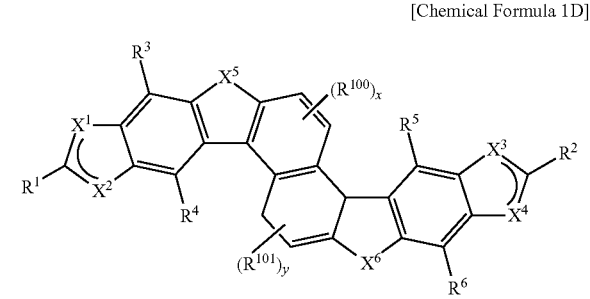

[Chemical Formula 1E]

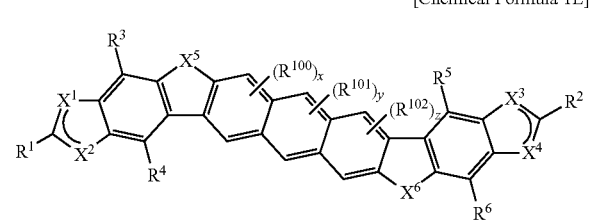

-continued

[Chemical Formula 1F]

[Chemical Formula 1G]

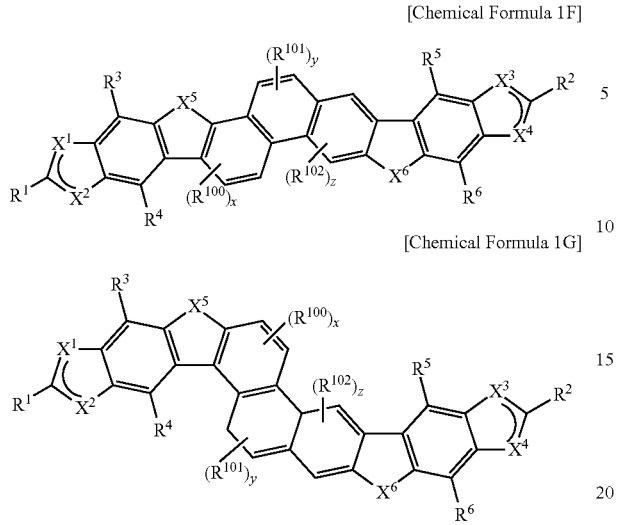

wherein, in the above Chemical Formulae 1A to 1G,
each of $X^1$ to $X^4$ are independently one of O, S, Se, Te, N—$R^a$, and $CR^b$, wherein each of $R^a$ and $R^b$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —$OR^{11}$, wherein $R^{11}$ is a substituted or unsubstituted $C_6$ to $C_{30}$ aryl group, a substituted or unsubstituted $C_4$ to $C_{30}$ cycloalkyl group, —$OR^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2R^{14}$, wherein $R^{14}$ is a substituted or unsubstituted $C_1$ to $C_{30}$ alkyl group, and —NHC(=O)$OR^{15}$, wherein $R^{15}$ is a substituted or unsubstituted $C_1$ to $C_{30}$ alkyl group,
at least one of $X^1$ and $X^2$ is selected from O, S, Se, Te, and N—$R^a$,
at least one of $X^3$ and $X^4$ is selected from O, S, Se, Te, and N—$R^a$,
each of $X^5$ and $X^6$ are independently one of O, S, Se, Te, N—$R^a$, and $CR^bR^c$ wherein each of $R^a$ to $R^c$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —$OR^{11}$, wherein $R^{11}$ is a substituted or unsubstituted $C_6$ to $C_{30}$ aryl group, a substituted or unsubstituted $C_4$ to $C_{30}$ cycloalkyl group, —$OR^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2R^{14}$, wherein $R^{14}$ is a substituted or unsubstituted $C_1$ to $C_{30}$ alkyl group, and —NHC(=O)$OR^{15}$, wherein $R^{15}$ is a substituted or unsubstituted $C_1$ to $C_{30}$ alkyl group,
each of $R^1$ to $R^6$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_6$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group,
each of $R^{100}$ to $R^{102}$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group, and
each of x, y, and z are integers of 1 or 2.

3. The thin film transistor according to claim 1, wherein one of $X^1$ and $X^2$ and one of $X^3$ and $X^4$ are selenium (Se), and
one of $X^5$ and $X^6$ is sulfur (S).

4. The thin film transistor according to claim 1, wherein Ar is one of substituted or unsubstituted benzene, substituted or unsubstituted naphthalene, and substituted or unsubstituted anthracene, and
each of $R^1$ and $R^2$ are independently a $C_1$ to $C_{30}$ alkyl group.

5. The thin film transistor according to claim 1, wherein the inorganic material includes one of $SiO_x$, $SiN_x$, $AlO_x$, or a combination thereof.

6. The thin film transistor according to claim 1, wherein the inorganic insulating layer has a thickness of about 100 nanometers to about 500 nanometers.

7. The thin film transistor according to claim 1, wherein in Chemical Formula 2, $R^1$ is hydrogen or a methyl group, each of $L^1$ and $L^3$ are independently a $C_1$ to $C_{20}$ alkylene group, and $L^2$ is —(C=O)—NR"— (wherein, R" is one of hydrogen and a $C_1$ to $C_6$ hydrocarbon radical).

8. The thin film transistor according to claim 1, wherein in Chemical Formula 2, $R^1$ is hydrogen, $L^2$ is —(C=O)—NR"— (wherein, R" is hydrogen), and each of $L^1$ and $L^3$ are independently a propylene group.

9. The thin film transistor according to claim 1, wherein the gate electrode is on a substrate, and
the substrate includes one of silica, glass, and plastic.

10. An electronic device comprising a thin film transistor according to claim 1.

11. The electronic device according to claim 10, wherein the electronic device is at least one of a liquid crystal display device, an organic light-emitting diode, an electrophoresis display device, a solar cell, an organic sensor, and a combination thereof.

12. A method of manufacturing a thin film transistor, the method comprising:
forming a gate electrode;
forming an insulator on the gate electrode including,
forming an inorganic insulating layer on the gate electrode, the inorganic insulating layer entirely comprising an inorganic material, and coating a polysiloxane on a surface of the inorganic insulating layer, the polysiloxane having an acrylic terminal group represented by Chemical Formula 2 on a surface of the inorganic insulating layer;

forming an organic semiconductor on the insulator by coating the organic semiconductor on the coated surface of the inorganic insulating layer through a solution process; and forming a source electrode and a drain electrode electrically connected to the organic semiconductor, respectively,

[Chemical Formula 2]

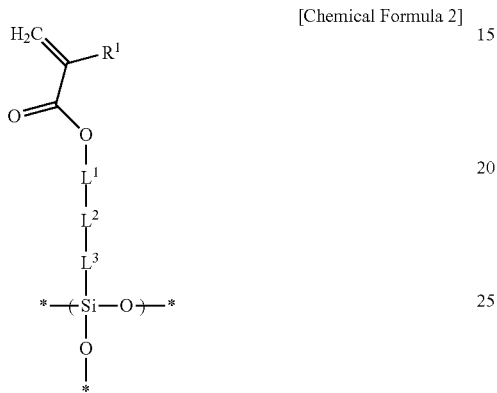

wherein, in Chemical Formula 2,
R$^1$ is hydrogen or a substituted or unsubstituted C$_1$ to C$_{20}$ alkyl group, each of L$^1$ and L$^3$ are independently one of a substituted or unsubstituted C$_1$ to C$_{20}$ alkylene group, a substituted or unsubstituted C$_6$ to C$_{20}$ arylene group, a substituted or unsubstituted C$_6$ to C$_{20}$ cycloalkylene group, a substituted or unsubstituted C$_2$ to C$_{20}$ alkenylene group, a substituted or unsubstituted C$_2$ to C$_{20}$ alkynylene group, —R—O—R'—, —R—N—R'—, —R—(C=O)—R'— (wherein, each of R and R' are independently C$_1$ to C$_{10}$ hydrocarbon radical), and a combination thereof, L$^2$ is one of —O—(C=O)—NR"—, —(C=O)—NR"— (wherein, R" is one of hydrogen and a C$_1$ to C$_6$ hydrocarbon radical), —O—, —COO—, and —S—, and

* is a portion linked to an adjacent molecule, wherein the forming an organic semiconductor coats the organic semiconductor represented by Chemical Formula 1 on the coated surface of the inorganic insulating layer,

[Chemical Formula 1]

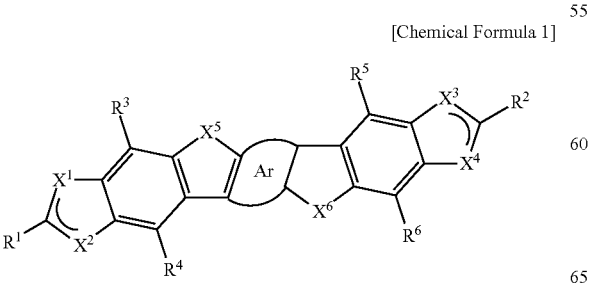

wherein, in Chemical Formula 1,
Ar is a substituted or unsubstituted C$_6$ to C$_{30}$ aromatic cyclic group, each of X$^1$ to X$^4$ are independently one of O, S, Se, Te, N—R$^a$, and CR$^b$, wherein each of R$^a$ and R$^b$ are independently one of hydrogen, a substituted or unsubstituted linear or branched C$_1$ to C$_{30}$ alkyl group, a substituted or unsubstituted C$_7$ to C$_{30}$ arylalkyl group, a substituted or unsubstituted C$_6$ to C$_{30}$ aryl group, a substituted or unsubstituted C$_1$ to C$_{30}$ alkoxy group, —OR$^{11}$, wherein R$^{11}$ is a substituted or unsubstituted C$_6$ to C$_{30}$ aryl group, a substituted or unsubstituted C$_4$ to C$_{30}$ cycloalkyl group, —OR$^{12}$, wherein R$^{12}$ is a substituted or unsubstituted C$_4$ to C$_{30}$ cycloalkyl group, a substituted or unsubstituted C$_2$ to C$_{30}$ heteroaryl group, —C(=O)R$^{13}$, wherein R$^{13}$ is a substituted or unsubstituted C$_1$ to C$_{30}$ alkyl group, —S(=O)$_2$R$^{14}$, wherein R$^{14}$ is a substituted or unsubstituted C$_1$ to C$_{30}$ alkyl group, and —NHC(=O)OR$^{15}$, wherein R$^{15}$ is a substituted or unsubstituted C$_1$ to C$_{30}$ alkyl group, at least one of X$^1$ and X$^2$ is selected from O, S, Se, Te, and N—R$^a$, at least one of X$^3$ and X$^4$ is selected from O, S, Se, Te, and N—R$^a$, each of X$^5$ and X$^6$ are independently one of O, S, Se, Te, N—R$^a$, and CR$^b$R$^c$, wherein each of R$^a$ to R$^c$ are independently one of hydrogen, a substituted or unsubstituted linear or branched C$_1$ to C$_{30}$ alkyl group, a substituted or unsubstituted C$_7$ to C$_{30}$ arylalkyl group, a substituted or unsubstituted C$_6$ to C$_{30}$ aryl group, a substituted or unsubstituted C$_1$ to C$_{30}$ alkoxy group, —OR$^{11}$, wherein R$^{11}$ is a substituted or unsubstituted C$_6$ to C$_{30}$ aryl group, a substituted or unsubstituted C$_4$ to C$_{30}$ cycloalkyl group, —OR$^{12}$, wherein R$^{12}$ is a substituted or unsubstituted C$_4$ to C$_{30}$ cycloalkyl group, a substituted or unsubstituted C$_2$ to C$_{30}$ heteroaryl group, —C(=O)R$^{13}$, wherein R$^{13}$ is a substituted or unsubstituted C$_1$ to C$_{30}$ alkyl group, —S(=O)$_2$R$^{14}$, wherein R$^{14}$ is a substituted or unsubstituted C$_1$ to C$_{30}$ alkyl group, and —NHC(=O)OR$^{15}$, wherein R$^{15}$ is a substituted or unsubstituted C$_1$ to C$_{30}$ alkyl group, and each of R$^1$ to R$^6$ are independently one of hydrogen, —F, —Cl, —Br, —I, a substituted or unsubstituted linear or branched C$_1$ to C$_{30}$ alkyl group, a substituted or unsubstituted linear or branched C$_2$ to C$_{30}$ alkenyl group, a substituted or unsubstituted linear or branched C$_2$ to C$_{30}$ alkynyl group, a substituted or unsubstituted C$_7$ to C$_{30}$ arylalkyl group, a substituted or unsubstituted C$_2$ to C$_{30}$ heteroarylalkyl group, a substituted or unsubstituted C$_2$ to C$_{30}$ alkylheteroaryl group, a substituted or unsubstituted C$_5$ to C$_{30}$ cycloalkyl group, a substituted or unsubstituted C$_2$ to C$_{30}$ heterocycloalkyl group, a substituted or unsubstituted C$_6$ to C$_{30}$ aryl group, and a substituted or unsubstituted C$_2$ to C$_{30}$ heteroaryl group, and wherein the coating the polysiloxane coats the polysiloxane at a thickness of about 40 nanometers to about 50 nanometers.

13. The method according to claim 12, wherein in Chemical Formula 2, R$^1$ is hydrogen or a methyl group, each of L$^1$ and L$^3$ are independently a C$_1$ to C$_{20}$ alkylene group, and L$^2$ is —(C=O)—NR"— (wherein, R" is one of hydrogen and a C$_1$ to C$_6$ hydrocarbon radical).

14. The method according to claim 12, wherein the forming an organic semiconductor coats at least one of fused polycyclic heteroaromatic compounds represented by the following Chemical Formulae 1A to 1G on the coated surface of the inorganic insulating layer,

[Chemical Formula 1A]

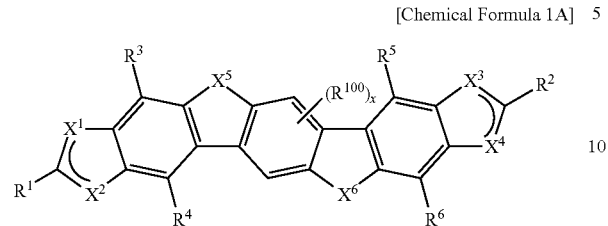

[Chemical Formula 1B]

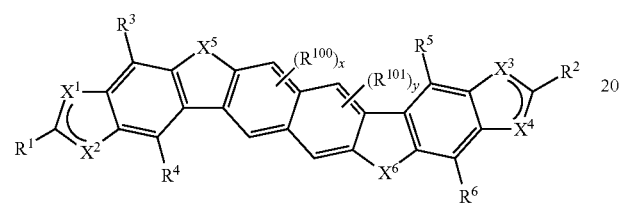

[Chemical Formula 1C]

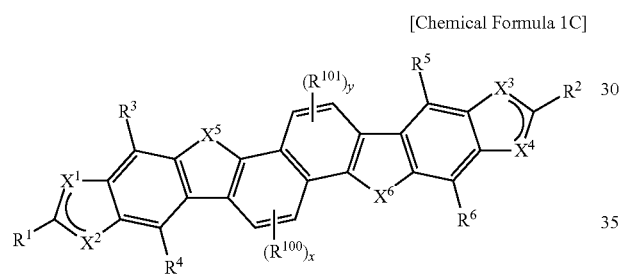

[Chemical Formula 1D]

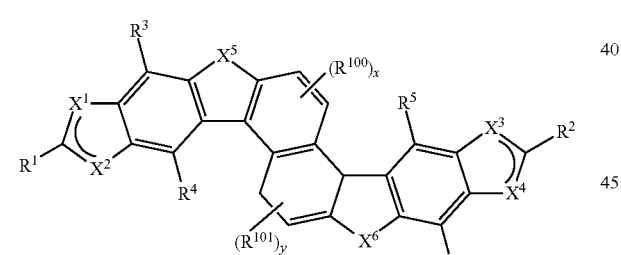

[Chemical Formula 1E]

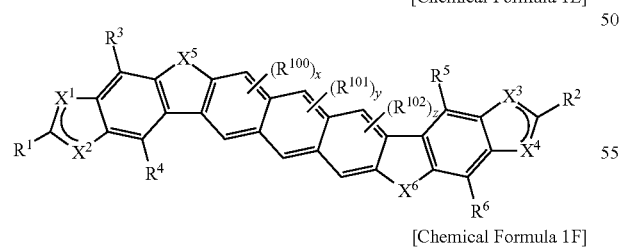

[Chemical Formula 1F]

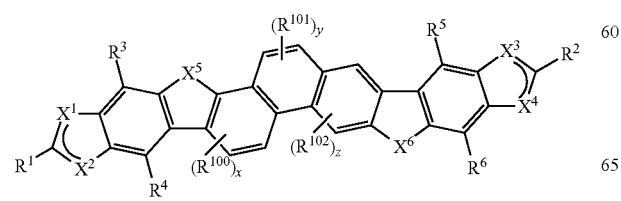

[Chemical Formula 1G]

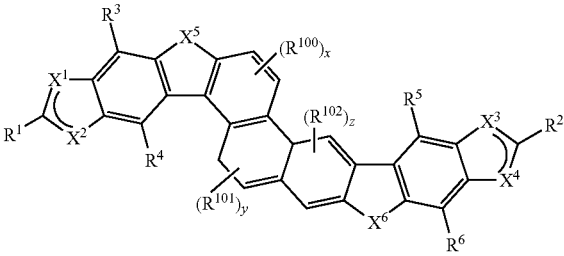

wherein, in the above Chemical Formulae 1A to 1G,
each of $X^1$ to $X^4$ are independently one of O, S, Se, Te, N—$R^e$, and $CR^b$, wherein each of $R^a$ and $R^b$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —$OR^{11}$, wherein $R^{11}$ is a substituted or unsubstituted $C_6$ to $C_{30}$ aryl group, a substituted or unsubstituted $C_4$ to $C_{30}$ cycloalkyl group, —$OR^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2R^{14}$, wherein $R^{14}$ is a substituted or unsubstituted $C_1$ to $C_{30}$ alkyl group, and —NHC(=O)$OR^{15}$, wherein $R^{15}$ is a substituted or unsubstituted $C_1$ to $C_{30}$ alkyl group,
at least one of $X^1$ and $X^2$ is selected from O, S, Se, Te, and N—$R^a$,
at least one of $X^3$ and $X^4$ is selected from O, S, Sc, Te, and N—$R^a$,
each of $X^5$ and $X^6$ are independently one of O, S, Se, Te, N—$R^a$, and $CR^bR^c$ wherein each of $R^a$ to $R^c$ are independently one of hydrogen, a substituted or unsubstituted linear or branched $C_1$ to $C_{30}$ alkyl group, a substituted or unsubstituted $C_7$ to $C_{30}$ arylalkyl group, a substituted or unsubstituted $C_6$ to $C_{30}$ aryl group, a substituted or unsubstituted $C_1$ to $C_{30}$ alkoxy group, —$OR^{11}$, wherein $R^{11}$ is a substituted or unsubstituted $C_6$ to $C_{30}$ aryl group, a substituted or unsubstituted $C_4$ to $C_{30}$ cycloalkyl group, —$OR^{12}$, wherein $R^{12}$ is a substituted or unsubstituted $C_4$ to $C_{30}$ cycloalkyl group, a substituted or unsubstituted $C_2$ to $C_{30}$ heteroaryl group, —C(=O)$R^{13}$, wherein $R^{13}$ is a substituted or unsubstituted $C_1$ to $C_{30}$ alkyl group, —S(=O)$_2R^{14}$, wherein $R^{14}$ is a substituted or unsubstituted $C_1$ to $C_{30}$ alkyl group, and —NHC(=O)$OR^{15}$, wherein $R^{15}$ is a substituted or unsubstituted $C_1$ to $C_{30}$ alkyl group,
each of $R^1$ to $R^6$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group, each of $R^{100}$ to $R^{102}$ are independently one of hydrogen, —F, —Cl, —Br, —I, a substituted or unsubstituted linear or branched $C_1$ to $C_{30}$ alkyl group, a substituted or unsubstituted linear or branched $C_2$ to $C_{30}$ alkenyl group, a substituted or unsubstituted linear or branched $C_2$ to $C_{30}$ alkynyl group, a substituted or unsubstituted $C_7$ to $C_{30}$ arylalkyl group, a substituted or unsubstituted $C_2$ to $C_{30}$ heteroarylalkyl group, a substituted or unsubstituted $C_2$ to $C_{30}$ alkylheteroaryl group, a substituted or unsubstituted $C_5$ to $C_{30}$ cycloalkyl group, a substituted or unsubstituted $C_2$ to $C_{30}$ heterocycloalkyl group, a substituted or unsubstituted $C_6$ to $C_{30}$ aryl group, and a substituted or unsubstituted $C_2$ to $C_{30}$ heteroaryl group, and each of x, y, and z are integers of 1 or 2.

15. The method according to claim 12, wherein the forming an inorganic insulating layer deposits one of $SiO_x$, $SiN_x$, $AlO_x$, and a combination thereof at a thickness of about 100 nanometers to about 500 nanometers using a plasma-enhanced chemical vapor deposition (PECVD) method or an atomic layer deposition (ALD) method.

\* \* \* \* \*